(12) United States Patent
Yu et al.

(10) Patent No.: US 8,754,514 B2
(45) Date of Patent: Jun. 17, 2014

(54) MULTI-CHIP WAFER LEVEL PACKAGE

(75) Inventors: Chun Hui Yu, Zhubei (TW);
Chih-Hang Tung, Hsin-Chu (TW);
Tung-Liang Shao, Hsin-Chu (TW);
Chen-Hua Yu, Hsin-Chu (TW);
Da-Yuan Shih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/206,694

(22) Filed: Aug. 10, 2011

(65) Prior Publication Data
US 2013/0037950 A1  Feb. 14, 2013

(51) Int. Cl.
| H01L 23/02 | (2006.01) |
| H01L 21/00 | (2006.01) |
| H01L 23/48 | (2006.01) |
| H01L 23/522 | (2006.01) |
| H01L 23/538 | (2006.01) |
| H01L 23/00 | (2006.01) |
| H01L 21/768 | (2006.01) |
| H01L 25/065 | (2006.01) |

(52) U.S. Cl.
CPC .......... *H01L 23/481* (2013.01); *H01L 23/5226* (2013.01); *H01L 23/5389* (2013.01); *H01L 24/19* (2013.01); *H01L 24/97* (2013.01); *H01L 21/76805* (2013.01); *H01L 21/76838* (2013.01); *H01L 25/0657* (2013.01)
USPC .......... 257/686; 257/687; 257/724; 257/774; 257/E23.02; 257/E21.502; 257/E21.602; 438/127; 438/613; 438/629; 438/637

(58) Field of Classification Search
CPC .............. H01L 23/481; H01L 23/5226; H01L 23/5389; H01L 24/19; H01L 24/97; H01L 21/76805; H01L 21/76838; H01L 25/0657
USPC ......... 257/685–687, 700–702, 723, 724, 774, 257/777, 787; 438/118, 125–127, 612, 613, 438/618, 622, 629, 637
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |

(Continued)

FOREIGN PATENT DOCUMENTS

| JP | 2001196525 A | 7/2001 |
| KR | 20090100895 A | 9/2009 |
| KR | 20100026764 A | 3/2010 |
| KR | 20110004120 A | 1/2011 |

*Primary Examiner* — Alonzo Chambliss
(74) *Attorney, Agent, or Firm* — Slater and Matsil, L.L.P.

(57) ABSTRACT

A multi-chip wafer level package comprises three stacked semiconductor dies. A first semiconductor die is embedded in a first photo-sensitive material layer. A second semiconductor die is stacked on top of the first semiconductor die wherein the second semiconductor die is face-to-face coupled to the first semiconductor die. A third semiconductor die is back-to-back attached to the second semiconductor die. Both the second semiconductor die and the third semiconductor die are embedded in a second photo-sensitive material layer. The multi-chip wafer level package further comprises a plurality of through assembly vias formed in the first photo-sensitive material layer and the second photo-sensitive material layer.

20 Claims, 13 Drawing Sheets

(56) References Cited

U.S. PATENT DOCUMENTS

| | | |
|---|---|---|
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,759,268 B2 | 7/2004 | Akagawa |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 * | 10/2007 | Lee et al. ........................ 257/777 |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,626,254 B2 * | 12/2009 | O et al. ........................ 257/686 |
| 7,671,457 B1 | 3/2010 | Hiner et al. |
| 7,807,512 B2 * | 10/2010 | Lee et al. ........................ 438/127 |
| 7,834,450 B2 | 11/2010 | Kang |
| 8,076,184 B1 | 12/2011 | Camacho et al. |
| 2006/0170098 A1 * | 8/2006 | Hsu ........................ 257/723 |
| 2008/0136004 A1 * | 6/2008 | Yang et al. ........................ 257/686 |
| 2008/0174008 A1 * | 7/2008 | Yang et al. ........................ 257/723 |
| 2009/0239336 A1 | 9/2009 | Lee et al. |
| 2010/0052187 A1 | 3/2010 | Lee et al. |
| 2010/0193932 A1 | 8/2010 | Kang et al. |

* cited by examiner

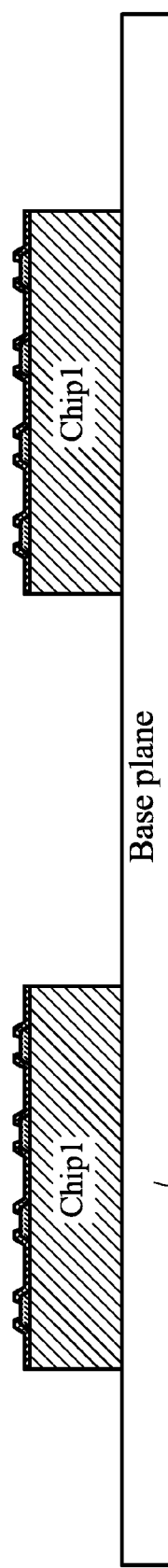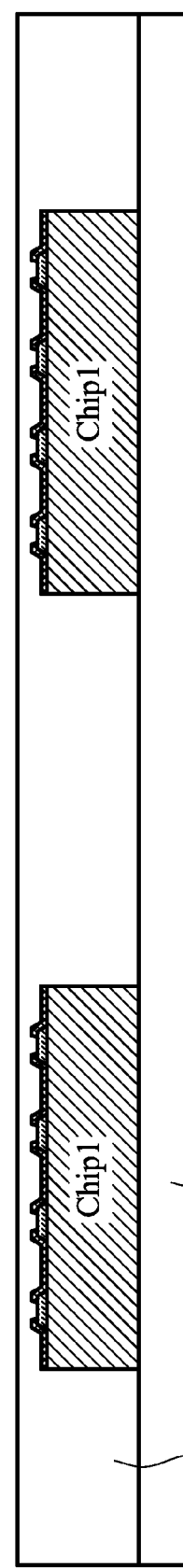

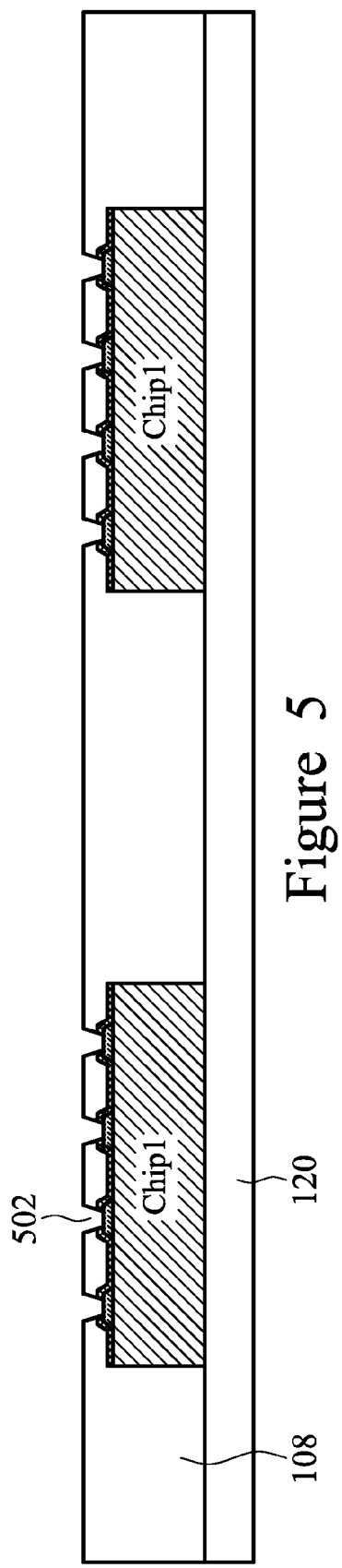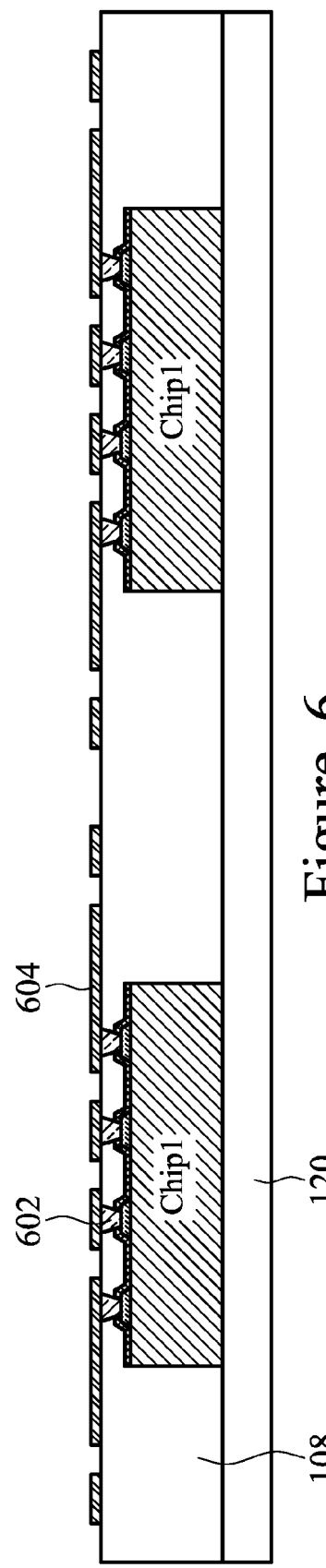

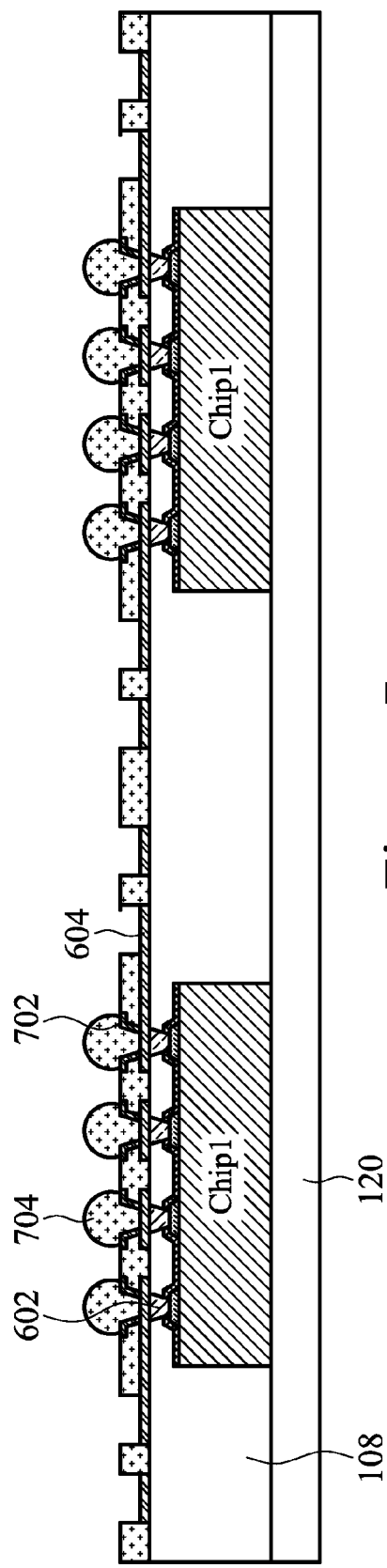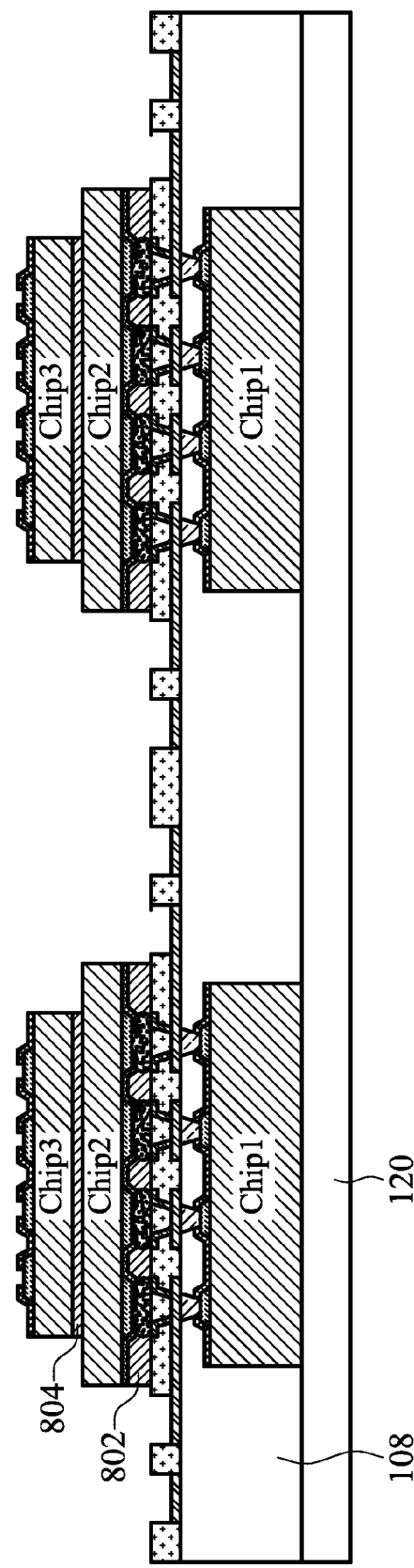

MULTI-CHIP WAFER LEVEL PACKAGE

BACKGROUND

Since the invention of the integrated circuit, the semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, multi-chip wafer level package based semiconductor devices have emerged as an effective alternative to further reduce the physical size of a semiconductor chip. In a wafer level package based semiconductor device, active circuits such as logic, memory, processor circuits and the like are fabricated on different wafers and each wafer die is stacked on top of another wafer die using pick-and-place techniques. Much higher density can be achieved by employing multi-chip semiconductor devices. Furthermore, multi-chip semiconductor devices can achieve smaller form factors, cost-effectiveness, increased performance and lower power consumption.

A multi-chip semiconductor device may comprise a top active circuit layer, a bottom active circuit layer and a plurality of inter-layers. In a multi-chip semiconductor device, two dies may be bonded together through a plurality of micro bumps and electrically coupled to each other through a plurality of through-silicon vias. The micro bumps and through-silicon vias provide an electrical interconnection in the vertical axis of the multi-chip semiconductor device. As a result, the signal paths between two semiconductor dies are shorter than those in a traditional multi-chip device in which different dies are bonded together using interconnection technologies such as wire bonding based chip stacking packages. A multi-chip semiconductor device may comprise a variety of semiconductor dies stacked together. The multiple semiconductor dies are packaged before the wafer has been diced. The wafer level package technology has some advantages. One advantageous feature of packaging multiple semiconductor dies at the wafer level is multi-chip wafer level package techniques may reduce fabrication costs. Another advantageous feature of wafer level package based multi-chip semiconductor devices is that parasitic losses are reduced by employing micro bumps and through-silicon vias.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3-14 are cross sectional views of intermediate stages in the making of a multi-chip semiconductor device in accordance with an embodiment;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a multi-chip wafer level semiconductor package. The invention may also be applied, however, to a variety of semiconductor devices.

Figure 1:
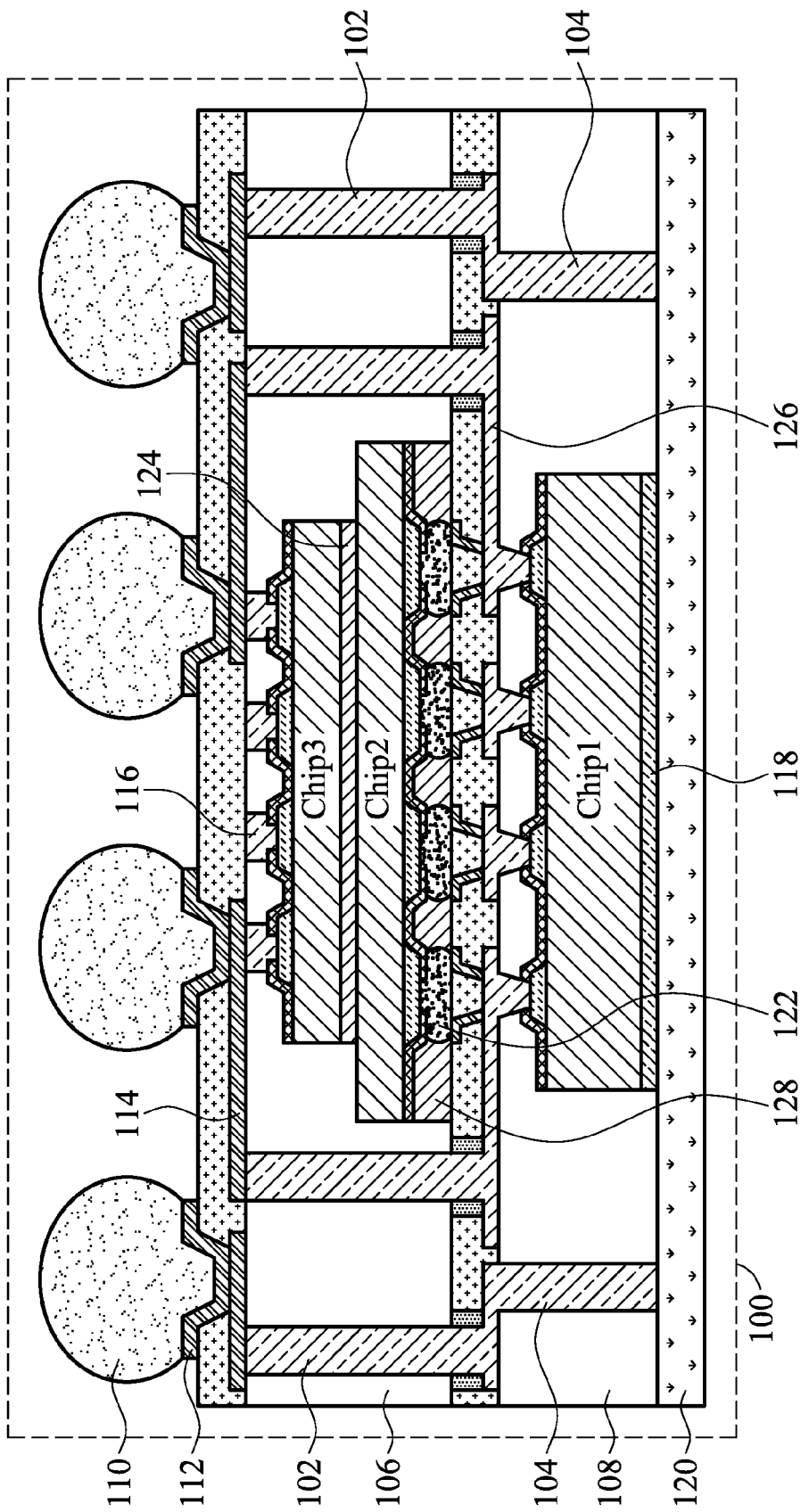
FIG. 1 illustrates a cross sectional view of a multi-chip semiconductor device in accordance with an embodiment.

Referring initially to FIG. 1, a cross sectional view of a multi-chip semiconductor device is illustrated in accordance with an embodiment. The multi-chip semiconductor device 100 comprises a first semiconductor die CHIP 1, a second semiconductor die CHIP 2 and a third semiconductor die CHIP 3. As shown in FIG. 1, the first semiconductor die CHIP 1, the second semiconductor die CHIP 2 and the third semiconductor die CHIP 3 are stacked together to form the multi-chip semiconductor device 100. More particularly, the first semiconductor die CHIP 1, the second semiconductor die CHIP 2 are stacked together using a plurality of metal bumps 122. The third semiconductor die CHIP 3 is back-to-back attached to the second semiconductor die CHIP 2 using an epoxy layer 124.

The multi-chip semiconductor device 100 further comprises a plurality of solder balls 110 as input/output (I/O) pads mounted on the top side of the multi-chip semiconductor device 100 using a plurality of under bump metallization (UBM) structures 112. In order to give a basic insight of the inventive aspects of various embodiments, the first semiconductor die CHIP 1, the second semiconductor die CHIP 2 and the third semiconductor die CHIP 3 are drawn without details. However, it should be noted the first semiconductor die CHIP 1, the second semiconductor die CHIP 2 and the third semiconductor die CHIP 3 may comprise basic semiconductor layers such as active circuit layers, substrate layers, inter-layer dielectric (ILD) layers and inter-metal dielectric (IMD) layers (not shown).

In accordance with an embodiment, the first semiconductor die CHIP 1 may comprise a plurality of logic circuits such as central processing unit (CPU), graphics processing unit (GPU) and the like. the second semiconductor die CHIP 2 and the third semiconductor die CHIP 3 may comprise a plurality of memory circuits such as static random access memory (SRAM) and dynamic random access memory (DRAM) and the like. It should be noted that the first semiconductor die CHIP 1, the second semiconductor die CHIP 2 and the third semiconductor die CHIP 3 may have many embodiments, which are also in the scope of the present disclosure.

The multi-chip semiconductor device 100 may comprise two photo-sensitive material layers 106 and 108. The second photo-sensitive material layer 106 is formed on top of the first photo-sensitive material layer 108. As shown in FIG. 1, the first semiconductor die CHIP 1 is embedded in the first photo-sensitive material layer 108. A plurality of through assembly vias (TAVs) 104 are formed through the first photo-sensitive material layer 108. It should be noted that while FIG. 1 illustrates a plurality of TAVs 104 formed in the first photo-sensitive material layer 108, some embodiments of the present disclosure may not comprise TAVs 104 in the first photo-sensitive material layer 108. TAVs 104 may be optional because it is not necessary to connect the active circuits of the first semiconductor die CHIP 1 with the input/output pads of the multi-chip device 100 through the TAVs 104 in the first photo-sensitive material layer 108.

The second photo-sensitive material layer 106 may embed the second semiconductor die CHIP 2, the third semiconductor die CHIP 3, a plurality of TAVs 102 and a plurality of TAVs 116. It should be noted, as shown in FIG. 1, both the TAVs 102 and the TAVs 116 are formed in the second photo-sensitive material layer 106. However, the TAVs 116 are formed between the third semiconductor die CHIP 3 and the sold ball side of the multi-chip semiconductor device 100. In contrast, the TAVs 102 are formed through the second photo-sensitive material layer 106 and further connected to a first redistribution layer 126 formed on top of the first photo-sensitive material layer 108. The formation processes of the photo-sensitive material layers 106, 108 and respective TAVs in each layer will be described in detail with respect to FIGS. 3-14.

The active circuit layer (not shown) of the first semiconductor die CHIP 1 is coupled to the active circuit layer (not shown) of the second semiconductor die CHIP 2 through the plurality of metal bumps 122. Furthermore, the first redistribution layer 126 and the TAVs 104 and TAVs 102 may form various connection paths so that the active circuits of both the first semiconductor die CHIP 1 and the second semiconductor die CHIP 2 can be connected with the solder balls 110. Likewise, the second redistribution layer 114 and the TAVs 116 may form various connection paths so that the active circuit (not shown) of the third semiconductor die CHIP 3 can be connected with the solder balls 110.

The multi-chip semiconductor device 100 may comprise a base plane 120 formed on the backside of the first semiconductor die CHIP 1. The base plane 120 may be formed of a conductive material such as copper, silver, gold, tungsten, aluminum, combinations thereof or the like. Alternatively, the base plane 120 may be formed of a wide variety of materials comprising glass, silicon, ceramics, polymers and the like. In accordance with an embodiment, the base plane 120 may be adhered on the backside of the semiconductor die CHIP 1 by an adhesive 118 such as thermal interface materials including epoxy and the like.

As shown in FIG. 1, the base plane 120 is formed directly adjacent to the first semiconductor die CHIP 1. Consequently, the base plane 120 may help to dissipate the heat generated from the first semiconductor die CHIP 1. As a result, the base plane 120 may help to reduce the junction temperature of the first semiconductor die CHIP 1. In comparison with a semiconductor die not having a base plane, the first semiconductor die CHIP 1 benefits from the heat dissipation from the base plane 120 so that the reliability and performance of the first semiconductor die CHIP 1 may be improved. In accordance with an embodiment, the thickness of the base plane 120 is in a range from 5 um to 50 um. It should be noted that the range of the thickness of the base plane is selected purely for demonstration purposes and are not intended to limit the various embodiments of the present disclosure to any particular thickness. One of ordinary skill in the art would recognize many variations, alternatives, and modifications.

Figure 2:
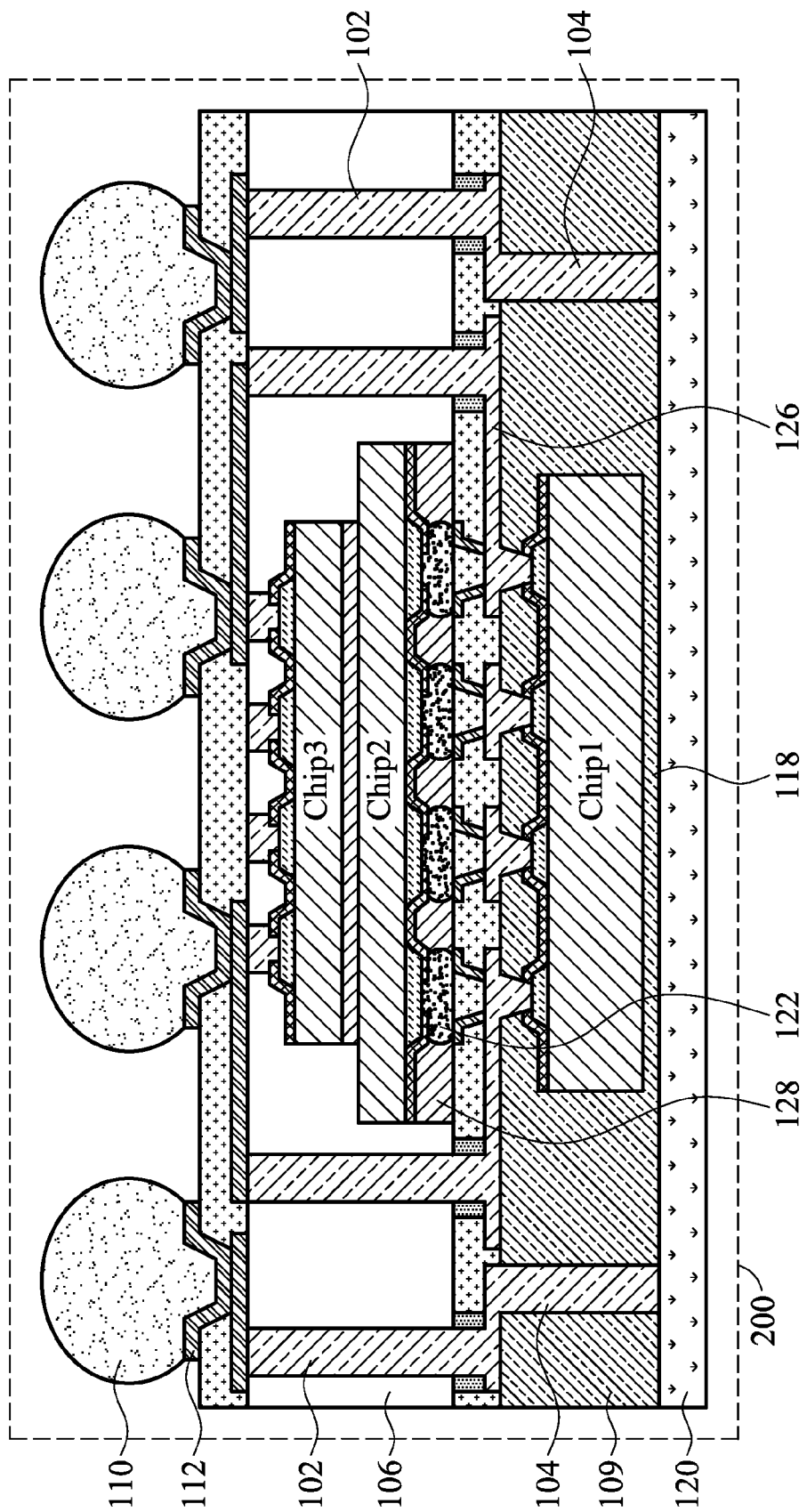
FIG. 2 illustrates a cross sectional view of a multi-chip semiconductor device in accordance with another embodiment

FIG. 2 illustrates a cross sectional view of a multi-chip semiconductor device in accordance with another embodiment. As shown in FIG. 2, the structure of the multi-chip semiconductor device 200 is similar to that of the multi-chip semiconductor device 100 shown in FIG. 1 except that the first photo-sensitive material layer 108 can be replaced by an encapsulation material layer 109. As known in the art, the encapsulation material layer may comprise molding compounds such as epoxy based resins and the like. The molding compound formed in the multi-chip semiconductor device 200 can help to protect the first semiconductor die CHIP 1 from heat, shock, humidity and corrosion. The formation of the encapsulation material layer is well known in the art, and hence is not discussed in detail herein.

FIGS. 3-14 are cross sectional views of intermediate stages in the making of a multi-chip semiconductor device in accordance with an embodiment. FIG. 3 illustrates a cross sectional view of placing a first semiconductor die CHIP 1 on the base plane 120. As shown in FIG. 3, the backside of the first semiconductor die CHIP 1 is mounted on the base plane 120. The first semiconductor die CHIP 1 may comprise active circuit layers, substrate layers, ILD layers and IMD layers (not shown). The first semiconductor die CHIP 1 may further comprise a plurality of metal pads whose connections are redistributed through a redistribution layer. It should be noted that while FIG. 2 illustrates two dies mounted on the base plane 120, the base plane 120 may accommodate any number of semiconductor dies.

FIG. 4 illustrates a cross sectional view of a first photo-sensitive material layer 108. The first photo-sensitive material layer 108 is formed on top of the first semiconductor die CHIP 1. As shown in FIG. 4, the first semiconductor die CHIP 1 is embedded in the first photo-sensitive material layer 108. The photo-sensitive material may comprise polybenzoxazole (PBO), SU-8 photo-sensitive epoxy, film type polymer materials and/or the like. It should be noted that while FIG. 4 illustrates a photo-sensitive material layer, the first photo-sensitive material layer 108 may be formed of polymer materials including non photo-sensitive materials such as molding compounds, rubber and/or the like. In accordance with an embodiment, the photo-sensitive material is either laminated or coated on a plurality of the first semiconductor dies CHIP 1 so as to form a reconfigured wafer comprising a plurality of semiconductor dies CHIP 1. One advantageous feature of having a photo-sensitive material layer laminated or coated on top of the first semiconductor die CHIP 1 is that the effective die area of CHIP is expanded so that a second semiconductor die CHIP 2 (not shown but illustrated in FIG. 8) can be either bigger or smaller than the first semiconductor die CHIP 1. In other words, the size of the first semiconductor die CHIP 1 is not limited by the size of the die subsequently stacked on top of the first semiconductor die CHIP 1.

FIG. 5 illustrates a cross sectional view of forming a plurality of openings in the first photo-sensitive material layer 108. In consideration of electrical and thermal needs, selective areas of the first photo-sensitive material layer 108 are exposed to light. The physical properties of the photo-sensitive regions exposed to light change as a result. According to an embodiment, the change of the physical properties of the exposed regions will cause the exposed regions etched away when a developer solution is applied to the first photo-sensitive material layer 108. As a result, a variety of openings 502 are formed. The formation of the openings 502 in the first photo-sensitive material layer 108 involves lithography operations, which are well known, and hence are not discussed in further detail herein.

FIG. 6 illustrates the formation of a plurality of TAVs and a redistribution layer. As shown in FIG. 6, a conductive material fills the openings 502 (not shown but illustrated in FIG. 5)

using an electroplating process. As a result, a plurality of TAVs 602 are formed in the first photo-sensitive material layer 108. The conductive material may be copper, but can be any suitable conductive materials, such as copper alloys, aluminum, tungsten, silver and combinations thereof. In order to redistribute the electrical connections from the TAVs 602, a redistribution layer 604 may be formed on top of the first photo-sensitive material layer 108. The redistribution layer 604 may be formed by means of an electroplating mechanism.

FIG. 7 illustrates the formation of a plurality of UBM structures and metal bumps. The plurality of UBM structures 702 are formed on top of the redistribution layer 604. The UBM structures 702 may help to prevent diffusion between the solder balls and the integrated circuits of the multi-chip semiconductor device, while providing a low resistance electrical connection. The metal bumps are an effective way to connect active circuits of two semiconductor dies in a multi-chip semiconductor device.

FIG. 8 illustrates the process of stacking the second semiconductor die CHIP 2 and the third semiconductor die CHIP 3 on top of the first semiconductor die CHIP 1. The backside of the third semiconductor die CHIP 3 is glued on top of the backside of the second semiconductor die CHIP 2 by employing an adhesive 804 such as epoxy, thermal interface materials and/or the like. The second semiconductor die CHIP 2 is coupled to the first semiconductor die CHIP 1 through a connection path formed by the metal bumps, the UBM structures, the redistribution layer and the metal pads.

An underfill material 802 (shown as layer 128 in FIG. 1 and FIG. 2) may be formed in the gap between the redistribution layer and the second semiconductor die CHIP 2. In accordance with an embodiment, the underfill material 802 may be an epoxy, which is dispensed at the gap between the redistribution layer and the second semiconductor die CHIP 2. The epoxy may be applied in a liquid form, and may harden after a curing process. One skilled in the art will recognize that dispensing underfill material 802 after attaching the second semiconductor CHIP 2 to the reconfigured wafer is simply one manner of forming the underfill material layer. A skilled person in the art will appreciate that there can be many embodiment variations of this disclosure. For example, an epoxy in liquid or semi-liquid form may be pre-applied to the top side of the first semiconductor die CHIP 1. Subsequently, the second semiconductor die CHIP 2 is pushed through the coating layer formed by the epoxy until the second semiconductor die CHIP 2 makes contact with the corresponding bumps 704 on top of the first semiconductor die CHIP 1. Alternatively, an underfill material may be applied to the top side of the first semiconductor die CHIP 1 to form an icy coating. Through a thermal curing process, the second semiconductor die CHIP 2 makes contact with the corresponding bumps 704 on top of the first semiconductor die CHIP 1. An advantageous feature of having the underfill material 802 is that the underfill material may help to reduce the mechanical and thermal stresses during the fabrication process of a multi-chip semiconductor device.

Figure 9:
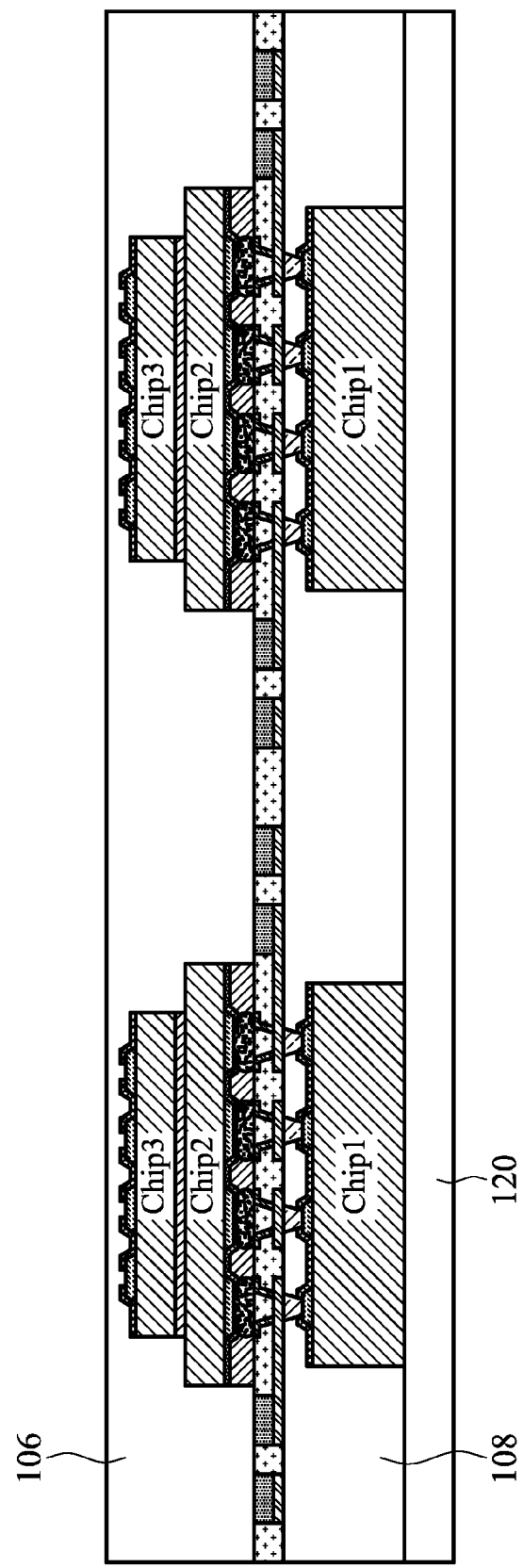

FIG. 9 illustrates a cross sectional view of a second photo-sensitive material layer 106. The second photo-sensitive material layer 106 is formed on top of the first photo-sensitive material layer 108. As shown in FIG. 9, the second semiconductor die CHIP 2 and the third semiconductor die CHIP 3 are embedded in the second photo-sensitive material layer 106. The process of forming a photo-sensitive material layer has been described above with respect to FIG. 4, and hence is not discussed in detail in order to avoid repetition.

Figure 10:
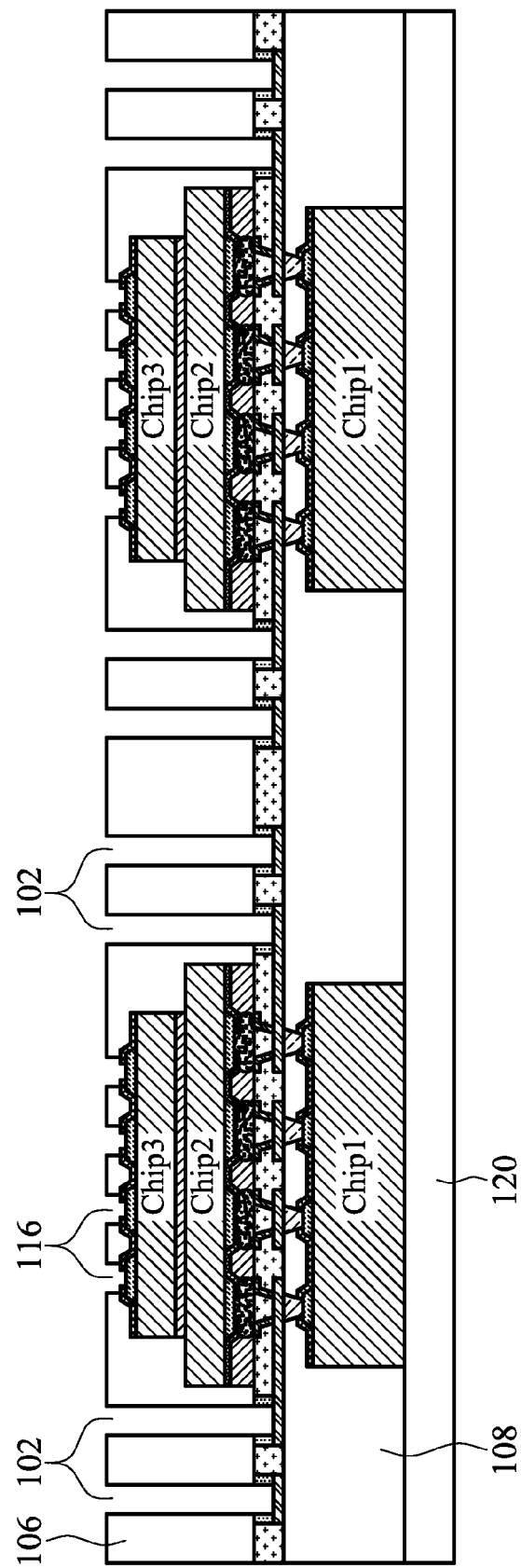

FIG. 10 illustrates a cross sectional view of forming a plurality of openings in the second photo-sensitive material layer 106. In consideration of electrical and thermal needs, selective areas of the second photo-sensitive material layer 106 are exposed to light. As a result, a variety of openings having different depths are formed. More particularly, a number of long openings 102 are formed through the second photo-sensitive material layer 106 and a number of short openings 116 are formed between the top side of the second photo-sensitive material layer 106 and the third semiconductor die CHIP 3.

Figure 11:
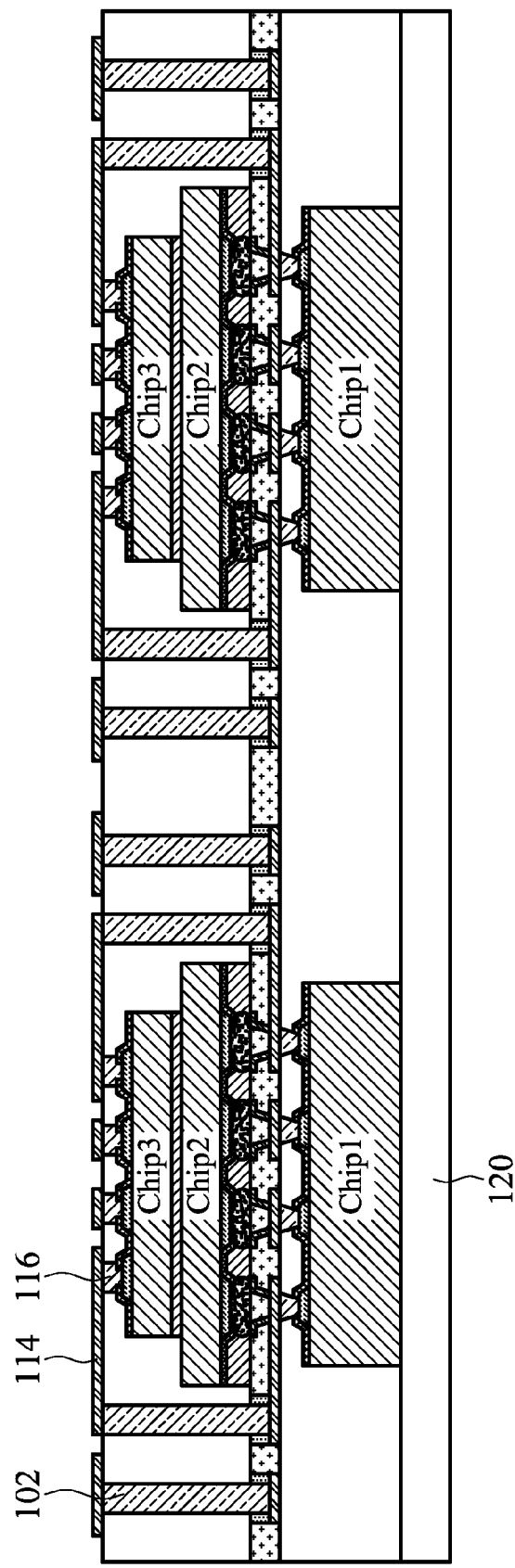

FIG. 11 illustrates the formation of a plurality of TAVs in the second photo-sensitive material layer 106 and a redistribution layer on top of the second photo-sensitive material layer 106. As shown in FIG. 11, a conductive material fills the openings 102 and 116. The conductive material may be copper, but can be any suitable conductive materials, such as copper alloys, aluminum, tungsten, silver and combinations thereof. In order to redistribute the electrical connections from the TAVs 102 and 116, a redistribution layer 114 may be formed on top of the second photo-sensitive material layer 106. The redistribution layer may be formed by means of an electroplating mechanism.

Figure 12:
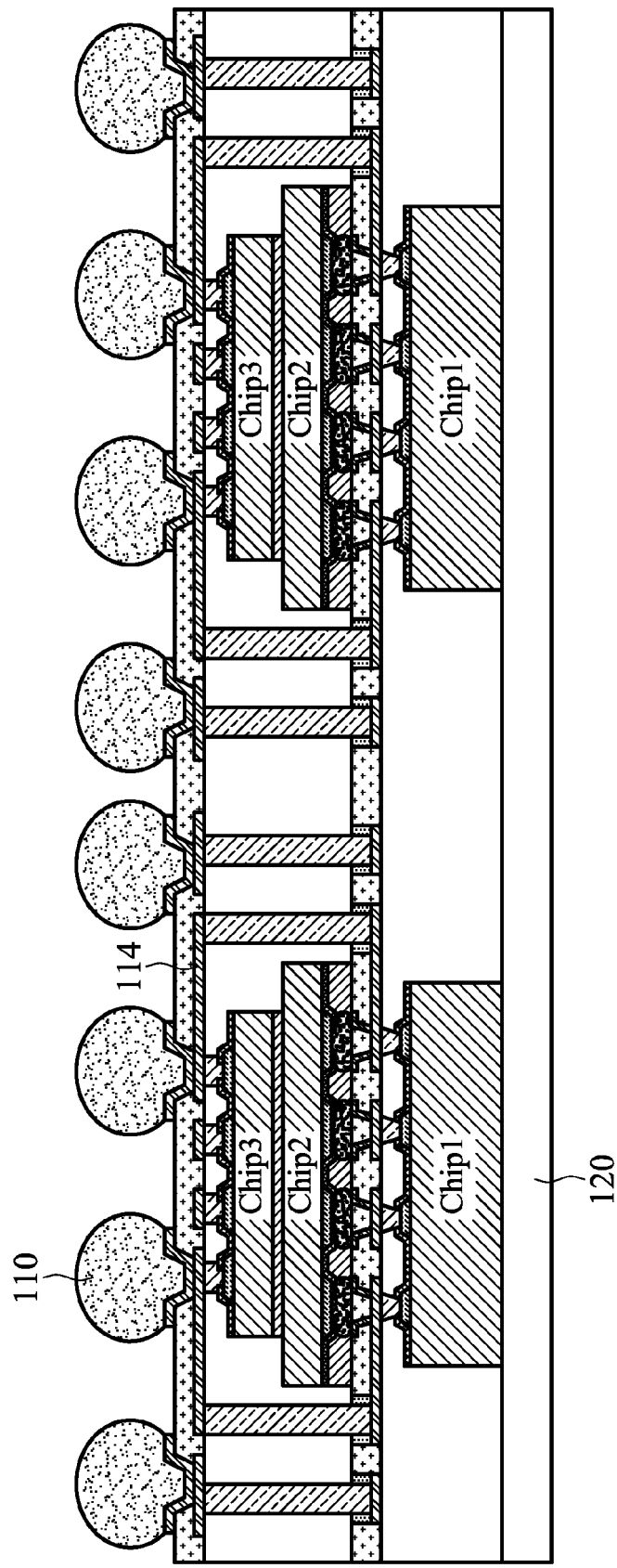

FIG. 12 illustrates the formation of a plurality of UBM structures and interconnection pads. The plurality of UBM structures are formed between the redistribution layer 114 and the solder balls 110. The UBM structures help to prevent diffusion between the solder balls and the integrated circuits of the multi-chip semiconductor device, while providing a low resistance electrical connection. The interconnection pads are I/O pads of the multi-chip semiconductor device. In accordance with an embodiment, the interconnection pads may be a plurality of solder balls 110. Alternatively, the interconnection pads may be a plurality of land grid array (LGA) pads.

Figure 13:
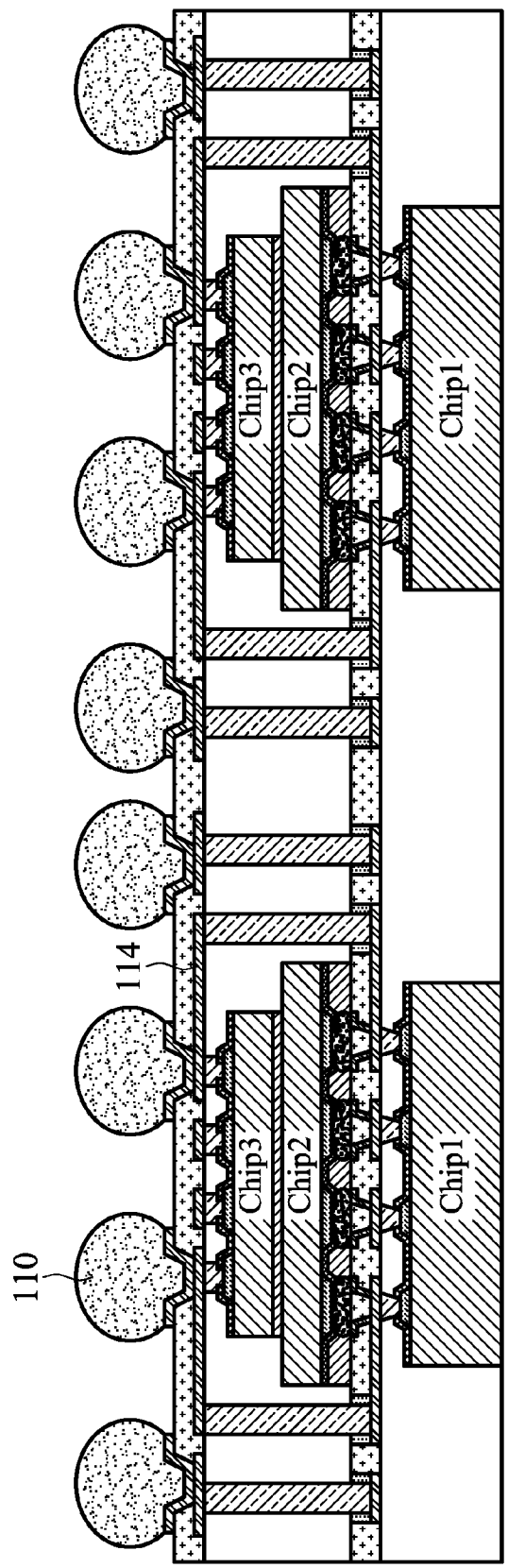
Figure 14:
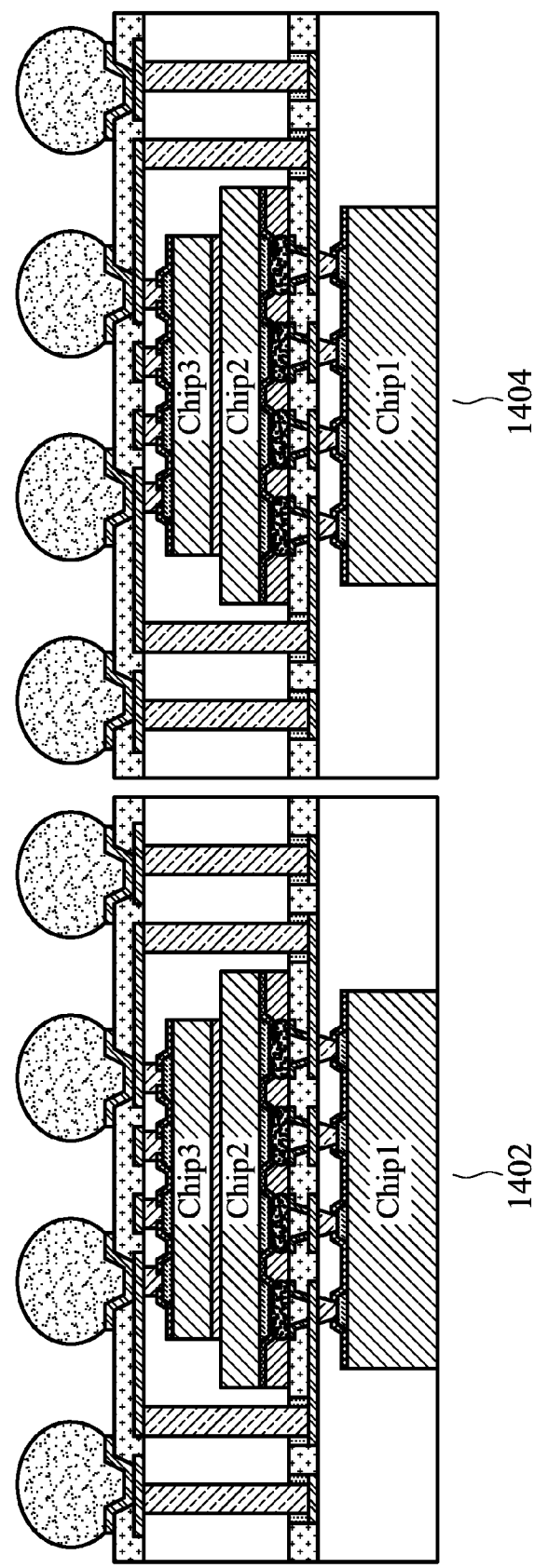

FIG. 13 illustrates a process of removing the base plane 120 from a multi-chip semiconductor device. In accordance with an embodiment, the base plane 120 is an optional component of the multi-chip semiconductor device. The base plane 120 can be detached from the multi-chip semiconductor device. A variety of detaching processes may be employed to separate the multi-chip semiconductor device from the base plane. The variety of detaching processes may comprise a chemical solvent, a UV exposure and the like. FIG. 14 illustrates a process of separating the reconfigured wafer into individual chip packages 1402 and 1404 using a dicing process. The dicing process is well known in the art, and hence is not discussed in detail herein.

Figure 15:
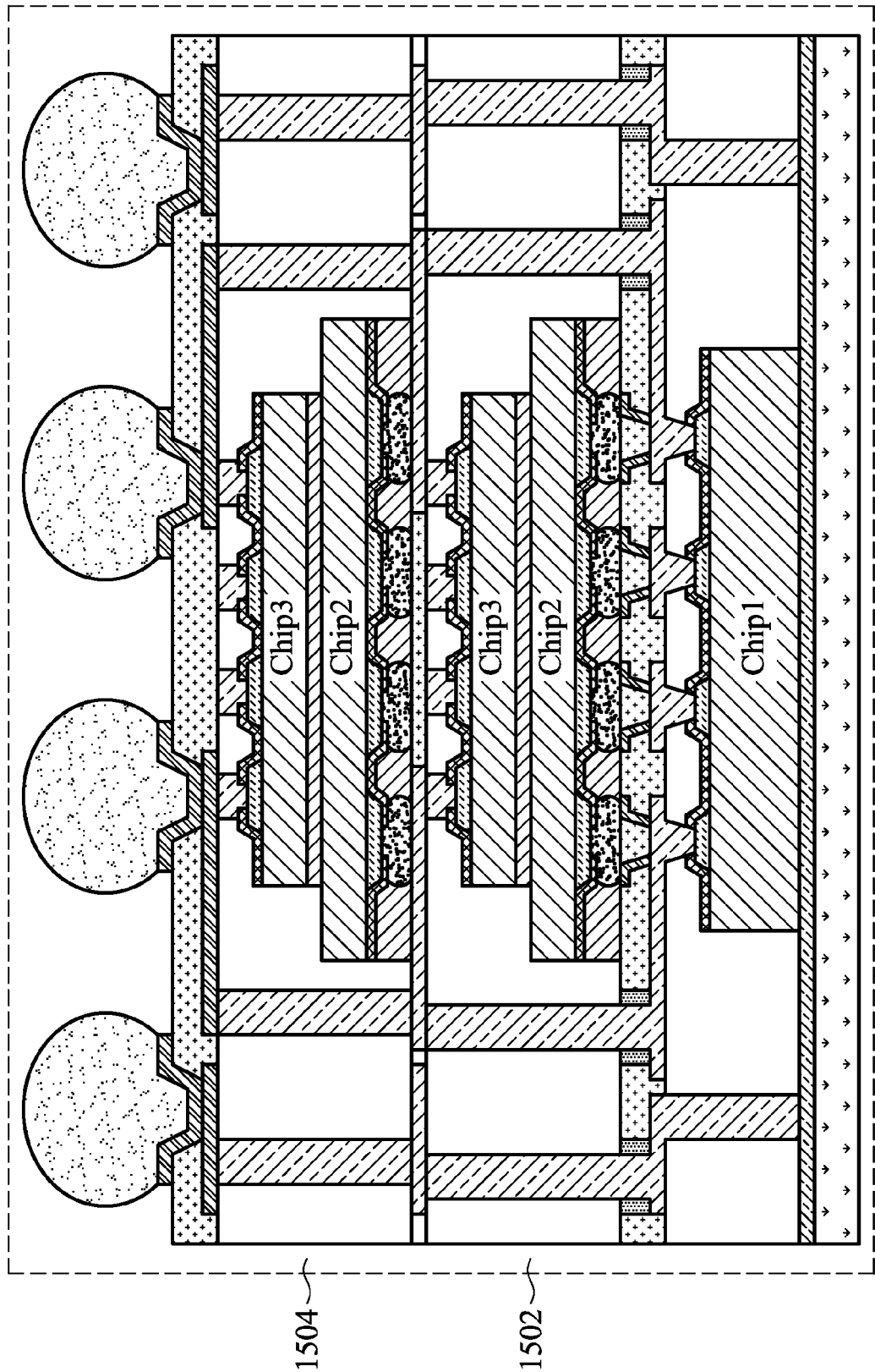
FIG. 15 illustrates another multi-chip semiconductor device in accordance with another embodiment.

FIG. 15 illustrates another multi-chip semiconductor device in accordance with another embodiment. As shown in FIG. 15, the structure the multi-chip semiconductor device 1500 is similar to that of the multi-chip semiconductor device 100 shown in FIG. 1 except that there is one additional layer 1504 having the same structure as the second layer 1502. The semiconductor chips in the third layer 1504 and the semiconductor chips in the second layer 1502 are electrically coupled through a plurality of micro bumps placed between the second layer 1502 and the third layer 1504.

Figure 16:
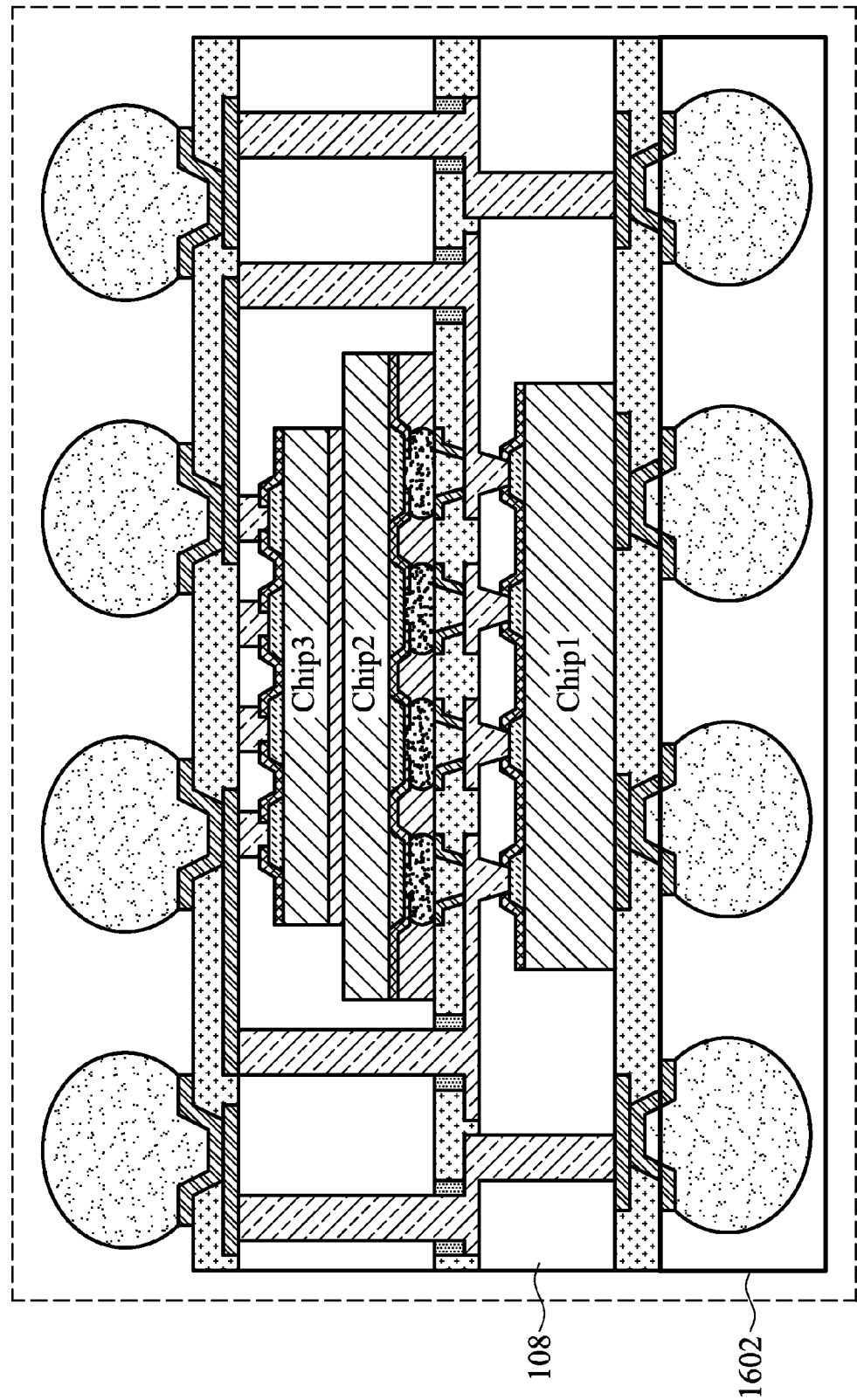
FIG. 16 illustrates a cross sectional view of another multi-chip semiconductor device in accordance with another embodiment.

FIG. 16 illustrates a cross sectional view of another multi-chip semiconductor device in accordance with another embodiment. As shown in FIG. 16, the structure the multi-chip semiconductor device 1600 is similar to that of the multi-chip semiconductor device 100 shown in FIG. 1 except that there may be a plurality of solder balls 1602 formed on the backside of the first photo-sensitive material layer 108. The formation of solder balls on a photo-sensitive material layer has been described above with respect to FIG. 12, and hence is not discussed again to avoid repetition. One advantageous feature of having a second group of solder balls 1602 formed on the backside of the first photo-sensitive material layer 108 is that a plurality of multi-chip semiconductor devices 1600 can be stacked on top of each other and electrically interconnected by the solder balls 1602.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a first semiconductor die embedded in a first photo-sensitive material layer;
   a second semiconductor die stacked on top of the first semiconductor die, wherein the second semiconductor die is face-to-face coupled to the first semiconductor die;
   a second photo-sensitive material layer formed on top of the first photo-sensitive material layer, wherein the second semiconductor die is embedded in the second photo-sensitive material layer;
   a dielectric layer directly in contact and between the first photo-sensitive material layer and the second photo-sensitive material layer, wherein a plurality of first vias formed between the first semiconductor die and the second semiconductor die and the first vias are formed in the first photo-sensitive material layer, and wherein a plurality of second vias formed in the dielectric layer and each second via is vertically aligned with a corresponding first via and a redistribution line is formed between the second via and the corresponding first via; and
   a plurality of through vias formed in the first photo-sensitive material layer and the second photo-sensitive material layer.

2. The device of claim 1, further comprising:
   a third semiconductor die placed on the second semiconductor die, wherein a backside of the third semiconductor die is attached to a backside of the second semiconductor die through a first adhesive material layer, wherein the third semiconductor die is embedded in the second photo-sensitive material layer.

3. The device of claim 2, wherein the plurality of through vias comprise:
   a first group of through vias formed between a front side of the third semiconductor die and a top side of the second photo-sensitive material layer;
   a second group of through vias formed between a front side of the first semiconductor die and a top side of the first photo-sensitive material layer; and
   a third group of through vias formed through the second photo-sensitive material layer.

4. The device of claim 2, further comprising:
   a base plane attached to a backside of the first semiconductor die through a second adhesive material layer;
   a plurality of metal bumps formed between the first semiconductor die and the second semiconductor die;
   a first redistribution layer formed on top of the first photo-sensitive material layer;
   a second redistribution layer formed on top of the second photo-sensitive material layer;
   an underfill material layer formed between the second semiconductor die and the first redistribution layer; and
   a plurality of solder balls formed on top of the second redistribution layer.

5. The device of claim 4, wherein the first redistribution layer and the plurality of metal bumps are configured such that:
   a variety of active circuits in the first semiconductor die are coupled to a variety of active circuits in the second semiconductor die through connection paths formed by the first redistribution layer and the plurality of metal bumps.

6. The device of claim 4, wherein the first redistribution layer, the plurality of metal bumps, the plurality of through vias and the second redistribution layer are configured such that:
   a variety of active circuits in the first semiconductor die and a variety of active circuits in the second semiconductor die are coupled to the plurality of solder balls through connection paths formed by the first redistribution layer, the plurality of metal bumps, the plurality of through vias and the second redistribution layer.

7. The device of claim 4, wherein the plurality of through vias and the second redistribution layer are configured such that:
   a variety of active circuits in the third semiconductor die are coupled to the plurality of solder balls through connection paths formed by the plurality of through vias and the second redistribution layer.

8. The device of claim 1, wherein a horizontal length of the first semiconductor die is smaller than a horizontal length of the second semiconductor die.

9. A device comprising:
   a first semiconductor layer comprising:
      a first semiconductor die embedded in a first photo-sensitive material layer; and
      a plurality of through vias formed in the first photo-sensitive material layer;
   a second semiconductor layer comprising:
      a second semiconductor die and a third semiconductor die are stacked together back to back through an adhesive material layer;
      a second photo-sensitive material layer, wherein the second semiconductor die and the third semiconductor die are embedded in the second photo-sensitive material layer, and wherein a dielectric layer directly in contact and between the first photo-sensitive material layer and the second photo-sensitive material layer, and wherein a plurality of first vias formed between the first semiconductor die and the second semiconductor die and the first vias are formed in the first photo-sensitive material layer, and wherein a plurality of second vias formed in the dielectric layer and each second via is vertically aligned with a corresponding first via and a redistribution line is formed between the second via and the corresponding first via;
      a plurality of through vias formed on top of the third semiconductor die;

a third semiconductor layer having an identical structure as the second semiconductor layer;

a first group of metal bumps formed between the first semiconductor layer and the second semiconductor layer; and a second group of metal bumps formed between the second semiconductor layer and the third semiconductor layer.

10. The device of claim 9, further comprising a first group of solder balls formed on top of the third semiconductor layer, wherein the first group of solder balls is used as input/output pads of the device.

11. The device of claim 10, wherein the first group of metal bumps and a plurality of through vias formed in the first semiconductor layer, the second semiconductor layer and the third semiconductor layer are configured such that:

a variety of active circuits in the first semiconductor die are coupled to the first group of solder balls through connection paths formed by the first group of metal bumps and the plurality of through vias.

12. The device of claim 9, further comprising a second group of solder balls formed on a backside of the first semiconductor layer, wherein the second group of solder balls is used as input/output pads of the device.

13. The device of claim 12, wherein the first group of metal bumps and a plurality of through vias formed in the first semiconductor layer are configured such that:

a variety of active circuits in the first semiconductor die are coupled to the second group of solder balls through connection paths formed by the first group of metal bumps and the plurality of through vias.

14. A method comprising:

forming a reconfigured wafer by embedding a first semiconductor die into a first photo-sensitive material layer;

forming a first group of through vias in the first photo-sensitive material layer;

connecting a second semiconductor die with the first semiconductor die through a plurality of metal bumps;

back-to-back attaching a third semiconductor die to the second semiconductor die using a first adhesive layer;

forming a second photo-sensitive material layer containing the second semiconductor die and the third semiconductor die, wherein a dielectric layer directly in contact and between the first photo-sensitive material layer and the second photo-sensitive material layer, and wherein a plurality of first vias formed between the first semiconductor die and the second semiconductor die and the first vias are formed in the first photo-sensitive material layer, and wherein a plurality of second vias formed in the dielectric layer and each second via is vertically aligned with a corresponding first via and a redistribution line is formed between the second via and the corresponding first via; and forming a second group of through vias in the second photo-sensitive material layer.

15. The method of claim 14, further comprising:

attaching the first semiconductor die on a base plane using an adhesive layer; and detaching the base plane from the first semiconductor die.

16. The method of claim 14, further comprising:

forming a plurality of metal bumps formed between the first semiconductor die and the second semiconductor die;

forming a first redistribution layer on top of the first photo-sensitive material layer;

forming a second redistribution layer on top of the second photo-sensitive material layer;

forming an underfill material layer between the second semiconductor die and the first redistribution layer; and forming a plurality of solder balls on top of the second redistribution layer.

17. The method of claim 14, further comprising:

forming a second group of solder balls on a backside of the first photo-sensitive material layer.

18. The method of claim 14, further comprising:

forming a first group of openings between a front side of the third semiconductor die and a front side of the second photo-sensitive material layer;

forming a second group of openings between a front side of the first semiconductor die and a front side of the first photo-sensitive material layer; and forming a third group of openings through the second photo-sensitive material layer.

19. The method of claim 18, further comprising:

electroplating conductive materials in the first group of openings;

electroplating conductive materials in the second group of openings; and electroplating conductive materials in the third group of openings.

20. The method of claim 14, further comprising:

sawing the reconfigured wafer into a plurality of packages, wherein each package comprises a plurality of semiconductor dies.

* * * * *